United States Patent [19]

Hauck et al.

[11] 3,996,662

[45] Dec. 14, 1976

[54] METHOD FOR THE MANUFACTURE OF A SUPERCONDUCTOR HAVING AN INTERMETALLIC TWO ELEMENT COMPOUND

[75] Inventors: Dietrich Hauck, Rodenbach, Stockheim; Manfred Wilhelm, Nurnberg, both of Germany

[73] Assignees: Siemens Aktiengesellschaft, Munich; Vacuumschmelze GmbH, Hanau, both of Germany

[22] Filed: June 20, 1974

[21] Appl. No.: 481,259

[30] Foreign Application Priority Data

June 22, 1973 Germany .......................... 2331919

[52] U.S. Cl. .................................................. 29/599
[51] Int. Cl.² ........................................ H01V 11/00
[58] Field of Search ............... 29/599; 174/126 CP, 174/DIG. 6; 148/11.5 R, 127

[56] References Cited

UNITED STATES PATENTS

| | | |
|---|---|---|
| 3,218,693 | 11/1965 | Allen et al. .......................... 29/599 |
| 3,625,662 | 12/1971 | Roberts et al. .................. 29/599 X |
| 3,652,967 | 3/1972 | Tanaka et al. ........... 174/126 CP X |
| 3,728,165 | 4/1973 | Howlett ......................... 148/11.5 R |
| 3,836,404 | 9/1974 | Strauss .......................... 148/11.5 R |

*Primary Examiner*—C.W. Lanham
*Assistant Examiner*—V. K. Rising
*Attorney, Agent, or Firm*—Kenyon & Kenyon Reilly Carr & Chapin

[57] ABSTRACT

A method of manufacturing a superconductor having a superconductive intermetallic compound of at least two elements in which a ductile component consisting of one element of the compound is brought into contact with a second component consisting of an alloy containing a ductile carrier metal and the remaining elements of the compound, after which the two components are subjected to a cross section reducing process and then heat treated such that the compound is formed through a reaction of the first component with the elements of the compound contained in the second component.

17 Claims, 3 Drawing Figures

METHOD FOR THE MANUFACTURE OF A SUPERCONDUCTOR HAVING AN INTERMETALLIC TWO ELEMENT COMPOUND

BACKGROUND OF THE INVENTION

This invention relates to the manufacture of superconductors in general and more particularly to an improved method of manufacturing a superconductor having a superconductive intermetallic compound made up of at least two elements.

Intermetallic superconducting compounds consisting of two elements of the type $A_3B$, for example, $Nb_3Sn$ or $V_3Ga$, and having an A-15 crystal structure are known to have very good superconductive properties and are distinguished in particular by a high critical magnetic field, a high transition temperature and a high critical current density. As a result, compounds of this nature are particularly well suited for superconducting coils used for generating strong magnetic fields such as those used for example, for research purposes. In addition, such coils find application in the superconducting magnets used in the suspended guidance of magnetic suspension railroads or in the windings of electric machines. More recently, ternary compounds such as, niobium-aluminum-germanium ($Nb_3Al_{0.8}Ge_{0.2}$) have become of particular interest. However, since these compounds are very brittle, considerable difficulty is encountered in their manufacture into a form suitable for use in magnet coils or the like.

One previous attempt at making suitable conductors comprise making wires and ribbons with surface layers of $Nb_3Sn$ by applying tin to a niobium wire or niobium ribbon electrolytically, by evaporation or some similar means and then diffusing it into the niobium through subsequent annealing at temperatures of between approximately 950° and 1000° C where the tin react with the niobium to form an $Nb_3Sn$ layer. With these processes, the wires or ribbons were then coated with a copper layer for electrical stabilization. Generally, this was done electrolytically. In another method which attempts to overcome some of the difficulties with with this method, a niobium layer is applied to a copper core to produce a stabilized ribbon or wire shaped superconductor with a niobium-tin layer on the surface. The niobium tin layer is formed by diffusing tin into the niobium in a well known manner. Such is disclosed in German Pat. No. 1,282,117.

These prior art methods, however, have various disadvantages. Primarily, they require relatively high diffusion temperatures. In addition, the manufacture of what is referred to as multi-core conductors with a multiplicity of thin, superconducting filaments embedded in a normally conductive matrix, caused considerable difficulties. This was due to the brittleness of the intermetallic compounds. Several further methods were developed, making possible the manufacture of superconductors with, in particular, two-component intermetallic compounds in the form of long wires or ribbons at low diffusion temperatures. These methods which are particularly applicable to the manufacture of multi-core conductors using wires of $Nb_3Sn$ and $V_3Ga$, embedded in a normal-conducting matrix, are carried out by surrounding a ductile element of the compound to be produced in wire form, such as a niobium or vanadium wire in a sheath of an alloy containing a ductile carrier metal and other elements of the compound, e.g., a copper-tin alloy or a copper-gallium alloy. In particular, multiplicity of such wires can be embedded in a matrix of the alloy. The structure so obtained is then subjected to a cross section reducing process. This results, on one hand, in a long wire such as that required by coils, and on the other hand, the reduction of the diameter of the wire which is, for example, niobium or vanadium to a low size in the order of about 30 to 50 $\mu$m. This is desirable in view of the superconductive properties of the conductor. In addition, the cross section reducing process obtains the best possible metallurgical bond between the wire and the surrounding jacket material of the alloy, without the occurance of reactions that lead to an embrittlement of the conductor. After the cross section-reducing process, the conductor, which consists of one or more wires and the surrounding matrix materal, is subjected to heat treatment in such a manner that the desired compound is formed through the reaction of the wire material such as niobium or vanadium with the additional element of the compound contained in the surrounding matrix. This additional material would be for example, tin or gallium. During this process, the element contained in the matrix diffuses into the wire material and reacts with the latter forming a layer consisting of the desired compound. Processes of this nature are disclosed in German Offenlegungsschrift 2,044,660, German Offenlegungsschrift 2,052,323, and German Offenlegungsschrift 2,105,828.

This process, however, suffers from a serious drawback. During diffusion, the entire element of the compound contained in the alloy sheath never diffuses into the wire or wires of the other element of the compound. Instead of being consumed in forming the compound, considerable quantities of this element remain in the matrix due to the diffusion conditions. This results in a relatively high electrical residual resistance in the portion of the matrix material containing some of the compound. For example, the residual resistance of copper increases quite steeply with an increasing gallium content. As a result, the sheath is not well suited as a stabilizing material for the superconductor. Electrical stabilization of the superconductor is, however, required as a rule, in order to prevent a sudden transition of the superconductor from the superconducting to the electrically normally conducting state. As is well known, the superconductor, in order to be stabilized, must be brought into intimate contact with a metal which is electrically and thermally highly conductive and is electrically normally conducting at the operating temperature of the superconductor, e.g., at 4.2 K. In addition, the stabilizing material must be able to rapidly remove the heat which is produced by the temporary local occurrence of normal conduction in the superconductor. This heat must be removed therefrom and transferred into the coolant such as liquid helium which surrounds the superconductor. In addition, the stabilizing material must be capable of taking over, at least for a short time, the current which normally flows through the superconductor, should a local occurrence of normal conduction come about. Copper, aluminum or silver, preferably in a highly purified form, as well suited as stabilizing materials.

Thus, it can be seen that all of the prior art processes for making intermetallic superconducting wires have drawbacks. The need for an improved process which avoids the above noted problems is therefor evident.

SUMMARY OF THE INVENTION

It is the object of the present invention to provide an improved method along the lines of the last mentioned method above, that takes advantage of the solid diffusion process but at the same time maintains good electrical stabilization of the superconductor. In accordance with the present invention, this is accomplished by enclosing a core of metal having high electrical and thermal conductivity and which is electrically normally conducting at the operating temperature of the superconductor in a jacket made of the first component of the desired intermetallic compound. The jacket is in turn enclosed by a sheath consisting of an alloy containing the second component and the structure so obtained then subjected to a cross section reducing deformation followed by heat treatment for formation of a compound.

During the heat treatment, diffusion takes place with the element in the outer sheath diffusing into the jacket and reacting with the jacket material to form a layer of the superconductive component. Typically, the sheath containing the other element or elements will contain these elements along with a carrier metal. However, diffusion of the elements of the compound contained in the sheath into the core of electrically and thermally highly conductive material enclosed by the jacket is prevented by the jacket. As a result, the residual resistance of the core material is not increased by diffusion of the elements into it. The core is in close mechanical contact with the jacket surrounding it due to the cross section reducing processing and thus, constitutes an extremely good stabilizer.

A method for manufacturing a multi-core conductor is disclosed in which a plurality of cores of electrical and thermally highly conductive material, each provided with a jacket of the first component are enclosed with a common sheath of the second component to form a matrix. In this process, the cores with jackets can first be subjected to a cross section reducing process before they are enclosed by the common sheath containing the second component. Thereafter, the multi-core conductor including the common sheath can be further reduced in size.

The method of the present invention is particularly well suited for manufacturing a superconductor having a superconductive intermetallic compound consisting of two elements of the type $A_3B$ with an A-15 crystal structure. In accordance with the process of the present invention, the sheath comprises a carrier metal, the lower-melting point element of the compound to be produced, with the jacket surrounding the core consisting of the element of the compound with a higher melting point. The elements vanadium and niobium are particularly well suited as the element A in the above formula. The element B in the equation above may be gallium or tin to form the compounds $V_3Ga$ and $Nb_3Sn$ which, because of their favorable superconduction properties, are particularly advantageous compounds.

To manufacture a superconductor having an intermetallic compound $V_3Ga$, a sheath preferably of copper, silver or copper-silver alloy and containing 0.1 to 30 atom-percent of gallium is used. Alloys with a gallium content of approximately 18 atom-percent and less are particularly advantageous for this purpose in view of their relatively good ductility. The heat treatment in forming the $V_3Ga$ layer can be performed at temperatures between 500° and 950° C. Depending on the gallium content of the alloy forming the sheath and the $V_3Ga$ layer thickness desired, the time of heat treatment can be between 5 minutes and 100 hours.

When manufacturing a superconductor having the intermetallic compound $Nb_3Sn$, the sheath will again preferably consist of copper, silver or copper-silver alloy containing 0.1 to 8 atom-percent of tin. In this case, a jacket of niobium encloses the core. Heat treatment is preferably performed at temperatures of between 700° and 850° C from a few minutes to about 20 hours.

It will be recognized that other ductile metals may also be used as carrier metals for the sheath as long as they do not react adversely with the elements of the compounds to be produced during the heat treatment.

The stabilizing core which is surrounded by the jacket can be any electrically and thermally highly conductive metal which is normally conducting at the operating temperature of the superconductor and which will not react during the heat treatment with the jacket material to form interfering layers. Particularly well suited beause of their melting point which is above the temperature of the heat treatment and their high electrical and thermal conductivity are copper and silver. The process is simplified if the core enclosed by the jacket is of the same metal as the carrier metal used in forming the sheath.

DETAILED DESCRIPTION OF PREFERRED EMBODIMENT

Figure 1:
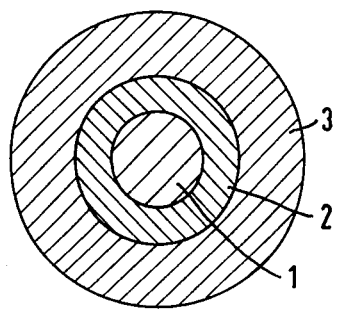
FIG. 1 is a schematic cross sectional view of a single core conductor structure according to the present invention.

FIG. 1 illustrates basic structure of the conductor according to the present invention. As an example it is assumed that the intermetallic compound $V_3Ga$ is to be manufactured. According to the present invention, a wire-shaped core 1 of copper is surrounded by a tubular vanadium jacket 2. The jacket 2 is then enclosed by a sheath 3 consisting of an alloy of copper and 18 atom-percent gallium. In fabricating the structure, the core 1 may be placed in the tube 2 and the structure so formed then placed, possibly after cross section reducing pre-treatments, in the tube 3 consisting of the copper-gallium alloy. The structure so obtained is then processed into a long wire of reduced cross section by suitable drawing or rolling steps. After the last process step, i.e., the last cross section reducing step, the wire is subjected to a heat treatment, preferably in a vacuum or in a protective gas. During this heat treatment, a portion of the gallium contained in the sheath 3 is diffused from the outside into the vanadium jacket 2 and reacts with the vanadium to form a $V_3Ga$ layer 4 as shown on FIG. 2. The heat treatment will preferably be performed at a temperature of between 600° and 800° C. A particularly good temperature is 660° C. Typically, heat treatment can last for approximately 50 hours. A conductor made in this manner, i.e., with heat treatment at 660° C for about 50 hours, resulted in a critical current density at a temperature of 4.2K and an external magnetic field

| Magnetic Field [T] | 1 | 2 | 3 | 4 | 5 | 6 | 7 | 7.5 |
|---|---|---|---|---|---|---|---|---|
| Critical Current I [A] | 51 | 36 | 28 | 22 | 18 | 14.8 | 12.3 | 11.1 | of about 5 Telsa of between approximately $10^4$ and $10^5$ A/cm$^2$, referred to the entire conductor cross section including the sheath and stabilizing material.

It will be recognized that superconductors having the intermetallic compound Nb$_3$Sn can be made in similar manner by using instead of a vanadium jacket a niobium jacket and by using a sheath made of a copper-tin alloy.

Figure 3:
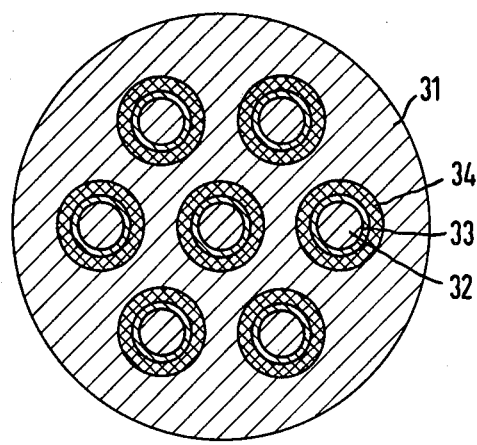
FIG. 3 is a schematic cross sectional illustration of a multi-core conductor produced in accordance with the present invention.

FIG. 3 illustrates a multi-core conductor made according to the present invention. As illustrated, a multiplicity of wire-shaped copper cores 32, each surrounded by a jacket 33 are arranged in a copper-gallium matrix 31. In a manner similar to that described above, the portion of the jacket 33 adjacent to the matrix 31 is converted through heat treatment into a layer 34 of the intermetallic compound V$_3$Ga. The conductor structure shown in FIG. 3 can be produced in a number of different ways. Copper wires 32 plated with a vanadium jacket 33 can each be enclosed into separate copper-gallium sheaths and then be deformed by cross-section reducing processes such that the individual copper-gallium sheaths together form the copper-gallium matrix 31. Further copper-gallium wires can also be packed into the bundle. Another manner of achieving this structure comprises providing a block of copper-gallium alloy with holes therein and then pushing into the holes copper cores provided with vanadium jackets. The resulting structure is then subjected to cross section reducing processes.

Figure 2:
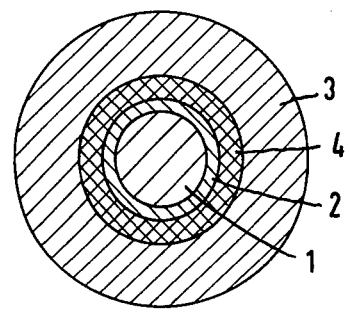
FIG. 2 is a similar view illustrating the conductor after final heat treatment for forming the intermetallic compound.

As with the single core conductors of FIGS. 1 and 2, multi-core conductors of the compounds Nb$_3$Sn can also be constructed in similar fashion using a copper-gallium matrix and niobium jackets.

EXAMPLE

A superconductor of the type shown in FIG. 3 was produced by first making wire-shaped copper cores 32 with a vanadium cladding 33 and with a copper-gallium sheath containing 18 atom-percent gallium surrounding the vanadium jackets. 61 of these wires were combined into a bundle and placed in a tube of ductile metal. This facilitated the cross section reducing process steps. The tube of ductile material was then dissolved after the cross-section reducing processing of the conductor. Cross section reducing was carried out until the outside diameter of the copper-gallium matrix formed in the process was about 0.4 mm. The individual vanadium jackets 33 had an outside diameter of about 35 $\mu$m and a wall thickness of about 7.5 $\mu$m after treatment. The outside diameter of the copper cores was about 20 $\mu$m. The thickness of the copper-gallium layer between individual vanadium jackets was about 13 $\mu$m. The conductor prepared in this manner was then annealed in a rarified argon atmosphere at a pressure of about 150 Torr for about 49 hours at 660° C. Through annealing, the boundary zone 34 adjacent to the copper-gallium matrix 31 of the individual vanadium jackets was changed into a V$_3$Ga layer of about 1 $\mu$m thick.

The critical currents carried by the superconductor manufactured in this manner at a temperature of 4.2 K are given in the following Table as a function of the external magnetic field measured in Teslas:

The effective critical current density measured over the entire conductor cross section, was in this case 1.25 $\times 10^4$ A/cm$^2$ at a temperature of 4.2 K and a magnetic field of 5 Teslas. In addition, the conductor exhibits an excellent electrical stability.

It is possible, of course, to convert the vanadium cladding of the individual cores completely into V$_3$Ga using the method of the present invention. It is important, however, that no gallium enters into the electrical highly conductive material of the core enclosed by the jacket. The extent to which the reaction of the vanadium jacket 33 with gallium to form V$_3$Ga is completed, will, of course, depend on the duration of the heat treatment along with the temperature used. In addition, the thickness of the jacket 33 and the amount of gallium available in the surrounding copper-gallium sheath are important. The thinner the jacket and the higher the gallium content of the alloy, the higher is the probability that the entire jacket will be reacted. The thickness of the reacted layer also increases with temperature used during heat treatment and with the duration of heat treatment. The exact reaction parameters can be established readily through experimentation.

Multi-core conductors manufactured according to the method of the present invention can advantageously be twisted about their longitudinal axis prior to the final heat treatment, so that the individual embedded superconductors follow helical paths in well known manner. In addition, the jackets which surround the cores of electrically highly conducting material need not consist of pure metals but can contain additives in well known manner. For example, 0.1 to 10 atom-percent of titanium, zirconium or hafnium can be added to the vanadium, or, for example, up to 25% by weight of tantalum to niobium.

In addition to the above noted advantages, the superconductor produced by the method according to the present invention, also has the advantage that the cross section of the cores used for stabilization as compared to the superconductor cross section itself can be varied within relatively wide limits in accordance with the requirements of a particular application. A superconductor manufactured in accordance with the present invention is also relatively well suited for application with a-c current or with slowly varying currents since due to the relatively high electrical resistance of the alloy sheath, eddy currents which typically occur in a multi-core conductor are rapidly attenuated. In addition, the method of the present invention has the advantage that the entire superconductor including stabilization can be constructed to a series of deformation passes prior to the heat treatment and need not be subjected to further process steps after heat treatment. In previously developed superconductors such as those in which V$_3$Ga cores are embedded in a matrix of a copper-gallium alloy, in principle the matrix on the outside can again be surrounded with stabilizing material. However, if this done prior to the heat treatment, gallium will diffuse during the heat treatment, not only into the vanadium cores, but also into the stabililizing material surrounding the copper-gallium alloy, thereby increasing its residual resistance and decreasing its stabilizing effect considerably. If the stabilizing material is not applied until after the heat treatment, the only practical manner of doing this is electrolytically, since sensitive layers of the superconductor component cannot be subjected to further deformation passes. Thus, the method of the present invention is a considerable simplification over these prior art expensive methods.

Thus an improved method of forming a superconductor having a superconducting intermetallic compound of at least two elements has been disclosed. Although specific methods have been illustrated and described, it will be obvious to those skilled in the art that various modifications may be made without departing from the spirit of the invention which is intended to be limited solely by the appended claims.

We claim:

1. A method for the manufacture of a superconductor having a superconducting intermetallic compound of at least two elements comprising the steps of:
    a. forming a core of metal selected from the group consisting of copper, silver, aluminum and alloys consisting of at least two of these metals;
    b. surrounding said core with a single closed jacket containing a ductile first component of the intermetallic compound to be formed selected from the group consisting of niobium and vanadium so that said core is in physical and electrical contact with said jacket;
    c. surrounding said jacket with a single closed sheath consisting of an alloy containing a ductile carrier metal and a second component of the intermetallic compound to be formed so that said jacket is in physical and electrical contact with said sheath;
    d. subjecting the composite structure made up of said core, said jacket and said sheath to a cross section reducing deformation; and
    e. after cross section reducing, subjecting the composite wire so formed to a heat treatment whereby said second component in said sheath will diffuse into said jacket and react with said first component to form a layer of said superconducting intermetallic compound in the area of said jacket adjacent to said sheath, with said core of metal remaining an electrically and thermally high conductive material to provide for stabilization of said superconducting intermetallic compound.

2. The method according to claim 1 wherein said intermetallic compound is of the type $A_3B$ having a A-15 crystal structure with the jacket containing the element having the higher melting point and the sheath containing the element having the lower melting point.

3. The method according to claim 1 wherein said intermetallic compound is $V_3Ga$.

4. The method according to claim 1 wherein said intermetallic compound is $Nb_3Sn$.

5. The method according to claim 1 wherein said core is one of the group consisting of copper and silver.

6. The method according to claim 1 wherein said core and the carrier metal in said sheath are the same metal.

7. The method according to claim 1 and further including the step of surrounding a plurality of said cores covered with said jackets with a common sheath containing said second component to form a matrix prior to said cross section reducing.

8. The method according to claim 7 wherein said intermetallic compound is of the type $A_3B$ having an A-15 crystal structure with the jacket containing the element having the higher melting point and the sheath containing the element having the lower melting point.

9. The method according to claim 8 wherein said intermetallic compound is $V_3Ga$.

10. The method according to claim 9 wherein said jacket consists of vanadium and said sheath consists of one of the group consisting of copper, silver and copper-silver alloy and 0.1 to 30 atom-percent of gallium.

11. The method according to claim 10 wherein said atom-percent of gallium is between 0.1 and 18 atom-percent of gallium.

12. The method according to claim 11 wherein said core is one of the group consisting of copper and silver.

13. The method according to claim 11 wherein said core and the carrier metal in said sheath are the same metal.

14. The method according to claim 8 wherein said intermetallic compound is $Nb_3Sn$.

15. The method according to claim 14 wherein said jacket consists of niobium and said sheath consists of one of the group consisting of copper, silver and a copper-silver alloy and 0.1 to 8 atom percent of tin.

16. The method according to claim 15 wherein said core is one of the group consisting of copper and silver.

17. The method according to claim 15 wherein said core and the carrier metal in said sheath are the same metal.

* * * * *